United States Patent

Tefft

[15] 3,639,975

[45] Feb. 8, 1972

[54] GLASS ENCAPSULATED SEMICONDUCTOR DEVICE FABRICATION PROCESS

[72] Inventor: Edward G. Tefft, Auburn, N.Y.

[73] Assignee: General Electric Company

[22] Filed: July 30, 1969

[21] Appl. No.: 846,186

[52] U.S. Cl. ....................29/580, 29/588, 156/17, 29/590

[51] Int. Cl. ....................B01j 17/00, H01l 5/00

[58] Field of Search ....................29/578, 580, 588, 590, 591; 156/17; 204/180 R, 181

[56] References Cited

UNITED STATES PATENTS

| | | | |
|---|---|---|---|
| 2,442,863 | 6/1948 | Schneider | 204/181 |
| 3,197,839 | 8/1965 | Tiemann | 29/589 UX |
| 3,200,311 | 8/1965 | Thomas et al | 29/580 X |
| 3,261,075 | 7/1966 | Carman | 29/588 |
| 3,288,662 | 11/1966 | Weisberg | 29/590 UX |

*Primary Examiner*—John F. Campbell
*Assistant Examiner*—W. Tupman
*Attorney*—Robert J. Mooney, Nathan J. Cornfeld, Carl O. Thomas, Frank L. Neuhauser, Oscar B. Waddell and Joseph B. Forman

[57] ABSTRACT

A silicon semiconductor device is manufactured by sandblasting a pellet from a wafer and etching the peripheral surface of the pellet formed by sandblasting with an essentially metal-ion-free acid in an environment also free of metal ions. The pellet is flushed after etching with deionized water and mounted between plates which expose only the peripheral surface. A thick glass layer is deposited on the peripheral surface of the pellet by electrophoresis and thereafter fired to form an impervious passivating and encapsulating layer tenaciously adhered to the pellet surface. Contacts are applied to form a completed device.

13 Claims, 5 Drawing Figures

INVENTOR:
EDWARD G. TEFFT,
BY Carl O. Thomas
HIS ATTORNEY.

INVENTOR:
EDWARD G. TEFFT,
BY Carl O. Thomas
HIS ATTORNEY.

GLASS ENCAPSULATED SEMICONDUCTOR DEVICE FABRICATION PROCESS

My invention is directed to a glass encapsulated and passivated semiconductor device having improved operational stability and voltage-blocking capabilities.

Glass encapsulated and passivated semiconductor devices have found widespread useage. Typically such devices are formed by fusing a thick glass layer around a semiconductive crystal pellet having contact metallization, backup plates or slugs, and leads attached. While such devices have achieved market acceptance attributable to a favorable balance of low fabrication costs and stability in operation, I have observed that device performance does not match that to be expected based on comparisons with differently packaged semiconductor devices. For example, the blocking voltage capabilities of glass encapsulated and passivated semiconductor devices is lower than that which would be predicted based on the choice of pellets and also failure of the devices is frequently more abrupt than with other types of devices.

It is accordingly an object of my invention to provide a process for fabricating glass encapsulated and passivated semiconductor devices in which blocking voltages are improved, operational stability is improved, and abrupt failures are reduced.

This and other objects of my invention are accomplished in one aspect by a process for fabricating a glass encapsulated and passivated semiconductor device having improved stability and voltage-blocking capabilities comprising subdividing a pellet from a semiconductive crystal having first and second opposed major surfaces and at least one junction located therebetween so that the pellet is provided with first and second spaced surfaces conforming to the major surfaces of the original crystal and a peripheral surface formed by subdividing which intersects the periphery of the junction. The peripheral surface of the pellet adjacent the junction is etched in an essentially metal-ion-free environment, and the pellet is flushed with an essentially metal-ion-free liquid. The pellet is mounted between plates associated with the first and second spaced surfaces so that peripheral surface is exposed. A thick glass passivant layer is applied to the peripheral surface of the pellet overlying the junction. The glass is fused to form a unitary, impervious thick glass passivating and encasing layer circumscribing the junction intersection with the peripheral surface and tenaciously adhered to the pellet. Contacts are applied to the glass-free surfaces.

My invention may be more fully appreciated by reference to the following detailed description considered in conjunction with the drawings, in which FIG. 1 is a schematic diagram of a process according to my invention;

In fabricating junction containing semiconductive crystal pellets for incorporation in glass encapsulated devices according to my invention I prefer to utilize as a starting element a silicon monocyrstalline wafer characterized by having opposed planar major surfaces which may be substantially parallel. One or more junctions may be preliminarily formed in the wafer by diffusion, alloying or any other conventional technique. Typically a wafer takes the form of a circular disc of from 1 to 2 inches in diameter, but may be utilized in a variety of configurations and sizes, provided, of course, that the wafter is adequately sized so that at least one pellet may be formed therefrom. Subdivision of the wafer to form the pellet as indicated by Step A in FIG. 1 may be accomplished in any one of a variety of ways. According to a preferred technique a wafer is releaseably mounted with one major surface adjacent a noncontaminating substrate, such as glass, quartz, etc. This may be accomplished, for example, by using wax as an adhesive for holding the wafer in position. To the opposite major surface of the wafer one or a plurality of spaced protective discs may be releasably mounted. Again wax may be interposed to secure adhesion. The wafer surface carrying the protective discs is then sandblasted so that the portions of the wafer not protected by the discs are eroded and a separate pellet remains beneath each disc. It is a characteristic of sandblasting that the peripheral surface of the pellets formed by wafer erosion and extending between the opposed major surfaces of the wafer, now corresponding to opposed planar surfaces of each pellet, will be sloped somewhat, conforming to the geometry of the disc immediately adjacent thereto and gradually increasing in cross section toward the substrate. If the wafer is initially oriented so that a zone of higher resistivity is nearer the protective discs than a zone of lower resistivity forming a junction therewith, a positive bevel angle will be formed by the edge intersection of the junction with the peripheral surface of each pellet so that a beneficial field-spreading effect is obtained which contributes to increasing the maximum voltage which can be safely blocked by the pellets. It is appreciated that the pellets may be subdivided from the wafer by conventional techniques other than sandblasting, such as scribing, sawing, etching, lapping, etc.

Figure 2:
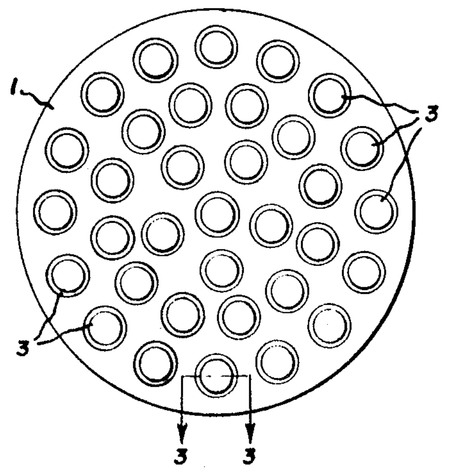
FIG. 2 is an elevational view of a plurality of substrate mounted pellets.
Figure 3:
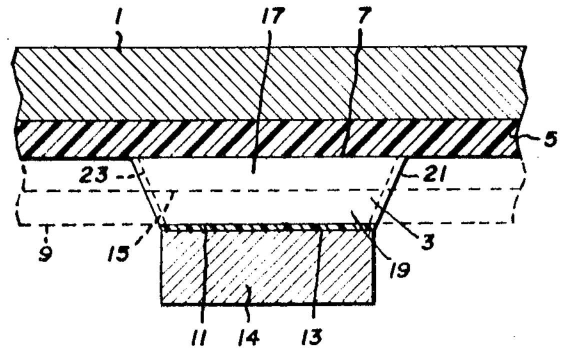
FIG. 3 is a sectional view taken along section line 3—3 in FIG. 2, with the pellet being schematically illustrated.

Referring to FIGS. 2 and 3 an exemplary arrangement of releaseably mounted pellets is shown as it appears immediately after subdivision by sandblasting. A mounting substrate 1 has a plurality of pellets 3 secured thereto by a releaseably adhesive layer 5. A major surface portion 7 of the pellet is adhered to the adhesive layer and constitutes a remanent of one major surface of the original wafer 9 indicated by dashed lines in FIG. 3. The pellet includes an opposed major surface portion 11 which is somewhat smaller in areal extent than the major surface portion 7. A releaseable adhesive layer 13 overlies the surface portion 11 bonding a protective disc 14, typically formed of an abrasion resistant material, such as quartz, metal, etc. The surface portion 11 is also a remanent from the original wafter. The pellet is shown for ease of illustration with a single junction 15 therein lying between the major surface portions, but it is appreciated that any number of junctions may be present. In the form shown the junction is formed by zones 17 and 19 exhibiting opposite conductivity-type characteristics and zone 19 preferably exhibiting a higher resistivity. The junction of the pellet lies with its entire peripheral edge in intersection with a beveled peripheral surface 21 formed by subdivision extending between the major surface portions. As schematically indicated, a thin layer 23 of the crystal lying adjacent the peripheral surface contains appreciable crystal lattice damage and/or impurities so that at this stage of fabrication the pellet can not be expected to block appreciable voltages, despite favorable beveling of the peripheral surface.

The pellets may be demounted from the substrate and residual wax or other adhesive removed by conventional techniques. For example, when wax is utilized as an adhesive, the wax may be stripped from the pellets by immersing the pellets in a suitable solvent therefor, such as trichlorethylene, and the solvent removed by immersing the pellets in an aliphatic alcohol, such as methyl or isopropyl alcohol. The residual alcohol may be removed merely by air drying the pellets.

To remove peripheral surface damage and/or impurities I contact the peripheral surface of each pellet, at least adjacent its intersection with the voltage-blocking junction or junctions, with an acid etchant capable of removing the damaged or contaminant containing portion of the crystal. This is indicated as Step B in FIG. 1. For silicon pellets acid etchants such as tripartite mixtures of nitric, hydrofluoric, and phosphoric acids; nitric, hydrofluoric, and glacial acetic acids; etc., have been found to represent satisfactory etchants. It is my recognition that a significant improvement in blocking voltage characteristics for pellets can be obtained over conventional fabrication techniques when etching of the peripheral surfaces of the pellets is undertaken in an essentially metal-ion-free environment—that is, essentially free of metal ions other than the comparatively small amounts that may initially be present on the peripheral surface of the pellet. According to conventional practice the wafer before subdivision into pellets is provided with contact metallization and, usually, backup plates also, before the peripheral surface of the pellet is etched. By contrast, I purposely provide no metallization of any type associated with the wafer or pellets which can come into contact with the etchant. By eliminating metallization associated with the pellets I am able to improve their blocking voltage characteristics. While I do not wish to be bound by any particular theory to account for this observed advantage, I believe that etching the pellets in an essentially metal-ion-free environment prevents or greatly reduces backplating—that is, redeposition—of metal ions onto crystal surfaces freshly exposed by etching.

Since some metal ions may be contained in the etchant derived from metal contaminants introduced onto the pellet peripheral surface during subdivision, it is a desirable precaution to flush the pellet with a metal-ion-free liquid, such as distilled or deionized water, immediately after etching. This prevents any small proportion of metal ion impurities which may be present in the etchant after use from back plating onto the pellet surface. The deionized water rapidly dilutes and sweeps away the etchant and thereby reduces the metal ion concentration. Tapwater which has been deionized to an extent sufficient to exhibit a resistivity of $10^6$ ohm-cm. or greater is fully suitable. While flushing of pellets with an essentially metal-ion-free liquid is not fully effective where etching has been undertaken in a metal-ion-containing environment, since the metal ion concentration is too high to prevent substantial instantaneous backplating, by bringing the pellets into an essentially metal-ion-free etching environment and also utilizing a flushing liquid which is essentially metal-ion-free, the availability of metal ions for backplating is drastically reduced and an exceptionally clean and contaminant-free peripheral surface is obtained on the pellets. The step of flushing is designated as Step C in FIG. 1.

According to a preferred technique I utilize a quartz substrate to mount the pellets and metal discs to protect the pellets during sandblasting. Metal discs are preferred because of their superior resistance to erosion during sandblasting. I subject the pellets with the substrate and discs attached in mounted relation to a preliminary etch followed by flushing. Thereafter the pellets are demounted from the substrate and discs and introduced alone into a polytetrafluoroethylene beaker containing the etchant for etching in an essentially metal-ion-free environment according to my invention. The etchant is partially decanted from the beaker and the flushing liquid introduced. It is appreciated that where the protective discs are formed of glass or quartz the preliminary etch before demounting could be eliminated entirely or this preliminary etching step could be utilized as the sole etching step. I have observed that it is advantageous to protect the major surface portions of the pellet from contact with the etchant in order to achieve a better ohmic contact thereto. Accordingly it is preferred that at least one of the etching steps be conducted with the pellets mounted to the substrate and discs.

Figure 1:
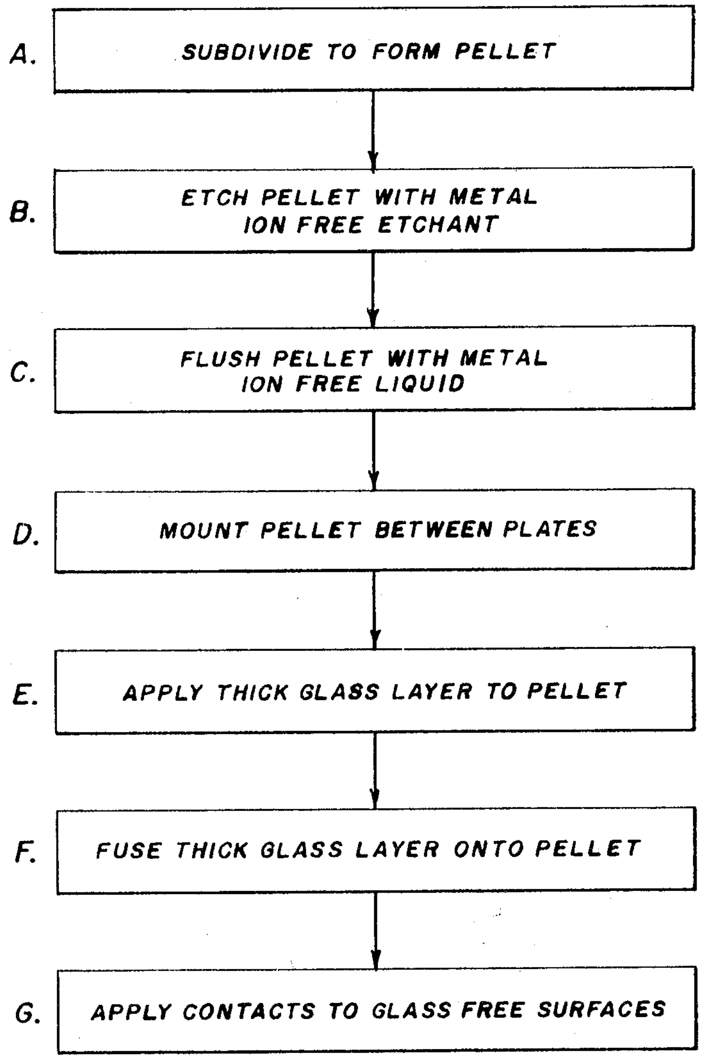

In keeping with a preferred practice of my invention pellet passivation and encapsulation is accomplished by mounting a pellet between plates which cooperate with the spaced, opposed major surface portions, as indicated by Step D in FIG. 1. The plates are preferably sized so as to conform to the periphery of the major surface portion with which they are associated. Thus, the plates effectively mask the major surface portions of the pellet while at the same time leaving the peripheral surface portion exposed and avoiding objectionable overhang of the plates beyond the peripheral surface.

A thick glass may be applied to the exposed peripheral surface of the pellet to any conventional technique, as indicated by Step E, FIG. 1. As employed herein the term "thick glass layer" refers to a glass layer having a thickness of greater than 1 mil. It is preferred to utilize a thick glass layer to passivate the peripheral surface so that the glass passivant layer will also be sufficiently rugged to act as a housing or encapsulant for the device without further shielding. Where it is desired to place the glassed pellet in an auxiliary casement, such as a hermetically sealed can, a molded plastic casement, a glass sleeve, etc., it is not essential that the glass layer exceed a mil in thickness.

Any one of a variety of well-known glass compositions may be utilized to act as a passivant and encapsulant. I prefer to utilize "soft glasses"—i.e., those having a fusing temperature below 800° C.—which exhibit a relatively low thermal coefficient of expansion. The glass exhibits a thermal expansion differential with respect to the semiconductive crystal of less than $5\times10^{-4}$. That is, if a unit length is measured along the surface of a semiconductive element with a layer of glass attached at or near the setting temperature of the glass and the semiconductive element and glass are thereafter reduced in temperature to the minimum ambient temperature to be encountered in use by a semiconductor device in which the semiconductive element is to be incorporated, the observed difference in the length of the glass layer as compared to the semiconductive element over the unit length originally measured at any temperature between and including the two extremes should be no more than $5\times10^{-4}$. It is appreciated that the thermal expansion differential so expressed is a dimensionless ratio of difference in length per unit length. By maintaining the thermal expansion differential below $5\times10^{-4}$ (preferably below $1\times10^{-4}$), the thermal stresses transmitted to the glass by the semiconductive element are held to a minimum, thereby reducing the possibility of cleavage, fracture, or spawling of the glass due to immediately induced stresses or due to fatigue produced by thermal cycling. Since the thick glass layer bridges at least one junction of the pellet, it is desirable that the glass exhibit an insulative resistance of at least $10^{10}$ ohm-cm., so as to avoid shunting any significant leakage current around the junction to be passivated. To withstand the high field strengths likely to be developed across the blocking junction during reverse bias, as is particularly characteristic of rectifiers, the glass layer is preferably chosen to exhibit a dielectric strength of at least 100 volts/mil and preferably at least 500 volts/mil for high-voltage rectifier uses.

Two exemplary soft glasses that meet the preferred thermal coefficient of expansion dielectric strength, and insulative resistance characteristics and which are considered particularly suitable for use with silicon pellets are set out in Table I, percentages being indicated on a weight basis.

TABLE I

| Composition | 7574 | No. 351 |
|---|---|---|
| $SiO_2$ | 12.35 % | 9.4 % |
| ZnO | 65.03 | 60.0 |
| $Al_2O_3$ | 0.06 | — |
| $B_2O_3$ | 22.72 | 25.0 |
| $CeO_2$ | — | 3.0 |
| $Bi_2O_3$ | — | 0.1 |
| PbO | — | 2.0 |
| $Sb_2O_3$ | — | 0.5 |

Both glasses have been used on commercially available semiconductor devices. Other zinc-silico-borate glasses are available that meet the required physical characteristics. For example, the zinc-silico-borate glasses disclosed by Martin in U.S. Pat. No. 3,113,878 and Graff in U.S. Pat. No. 3,441,422, may be employed.

According to a preferred practice of my invention the thick glass layer is formed on the peripheral surface of the pellet by electrophoretically depositing finely divided glass particles from suspension. Electrophoretic deposition offers the distinct advantages of being accurately controllable and entirely selective to the peripheral surface. The plates may be utilized to mask the spaced major surface portions of the pellet, so that glass deposition on these surfaces is minimized or avoided entirely. The plates are preferably themselves protected from glass deposition by an external coating of dielectric material. One or both of the plates may be relied upon to bring the pellet to the desired electrical potential for glass deposition. In order to insure uniformity of the glass coating it is preferred to rotate the pellet and associated plates as a unit during glass deposition.

Following a specific suspension forming technique the glass is divided into fine particles and passed through a 400-mesh sieve. Approximately 5 grams of the sieved glass are added to each 100 cc. of a carrier liquid, such as isopropanol, ethyl acetate, methanol, deionized water, etc. The suspension is first mechanically stirred and the suspension subjected to ultrasonic agitation for 30 minutes. The suspension is allowed to stand for 30 minutes, again stirred for 5 minutes, and finally allowed to stand for 20 minutes before decanting the carrier fluid with the glass particles suspended from the settled particles. Other conventional approaches are of course available for achieving a suspension of the glass in the carrier. When the carrier fluid with the glass particles suspended is placed in a container for use, ammonia is bubbled through the carrier to activate the solution. The ammonia is believed to assist in placing a surface charge on the glass particles for inducing migration with the field between the pellet and a spaced electrode and is believed to improve the adherence of the glass to the pellet's peripheral surface. With the preferred glasses set forth in Table I, the preferred carrier fluids, and using ammonia as an activator the glass particles are positively charged and migrate to the peripheral surface of the pellet, which is maintained at a negative potential with respect to a grounded spaced electrode. Employing electrode to pellet potential differences of from 100 to 200 volts and spacings therebetween of from 1 to 5 centimeters I have observed that thick glass layers of up to 8 to 10 mils in thickness at their thickest point can be formed. In order to assure uniformity of the glass layer the pellets may either be rotated during deposition so that all portions of the peripheral surface uniformly approach the spaced electrode or else the spaced electrode may be concentrically constructed of an annular configuration so that it is at all times equally spaced from all portions of the peripheral surface.

After glass deposition, the pellet is preferably fired after air-drying, as indicated by Step F. The purpose of firing is to bring the glass particles to a temperature at which their viscosity is decreased to the point they may coalesce and form a continuous, nonparticulate mass. Since glasses, unlike crystalline materials, do not possess a well-defined melting point, but progressively decline in viscosity when exposed to increasing temperatures, it is recognized that a wide range of firing temperatures may be usefully employed, even considering a single glass composition. Accordingly, the glass-firing temperature is not considered critical, any temperature above 630° C. being to some extent useful. The maximum firing temperature is, of course, maintained well below the melting temperature of the semiconductive crystal forming the pellet—for silicon, below about 1,000° C. It may be particularly advantageous to preheat zinc silico-borate glass coated pellets to a temperature in the range of from 500° to 615° C. for 5 minutes or longer, to fire a temperature in the range of from 650° to 750° C. for 5 to 60 minutes, and to thereafter anneal the glass by maintaining the pellet at the preheating temperature range for a period of at least 30 minutes, preferably in excess of an hour. It is, of course, recognized that by going to somewhat higher temperature ranges firing times may be decreased and vice versa.

Figure 4:
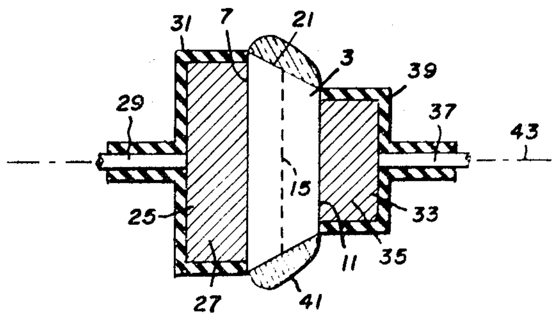
FIG. 4 is a sectional view of a glassed pellet positioned between mounting plates.

For the purpose of clearly illustrating the physical association of the pellet peripheral surface, the plates, and the thick glass layer in the practicing of my invention, attention is directed to FIG. 4. The pellet 3 is mounted with a first plate 25 adjacent a first major surface portion 7. The first plate is comprised of an electrically conductive central portion 27 having a mounting rod 29 conductively attached thereto and a dielectric exterior surface layer 31. It is to be noted that the exterior surface layer of the plate does not extend beyond the first major surface portion, but substantially conforms to the periphery thereof. A second plate is formed similarly as the first plate having a central conductive portion 33 and a conductive mounting rod 37 covered by an exterior surface layer 39. The second plate differs from the first in that it is sized differently so that it conforms to the periphery of the second major surface portion 11, which, because of beveling of the peripheral surface 21 of the pellet, is somewhat smaller than the first major surface portion. Where the current-carrying capacity of the completed device does not require a contact area associated with the entire surface portions of the pellet, the plates may be sized so that they are substantially smaller than the associated surface portions. An annular thick glass layer 41 is shown overlying the peripheral surface of the pellet so that it overlies and passivates the junction 15 of the pellet. It is to be noted that the mounting rods 29 and 37 lie along a common axis 43 to facilitate rotation of the pellet and the plates.

The structural arrangement shown in FIG. 4 is quite advantageous for electrophoretically depositing the thick glass layer in that it allows a direct electrical connection to be conveniently made to either or both plates and at the same time shields the plates and mounting rods from direct deposition of glass so that the glass is selectively applied to the peripheral surface of the pellet. Where a refractory insulative exterior surface layer has been applied to the plates such as hard glass or ceramic the plates may be retained in position during fusion of the thick glass layer. Alternately, refractory plates may be substituted to mount the pellets during firing. In order to assure uniform glass formation the assembly is preferably rotated about the central axis 43 both during electrophoresis and firing.

After glassing the pellet between the plates in the arrangement shown the pellet may be readily demounted from the plates and contacts applied to the opposed major surface portions, as indicated by process Step G, FIG. 1. In most instances the plates will provide sufficient masking that contact metallization may be applied to these surfaces directly after demounting. If, however, glass should find its way to one or both of the major surfaces portions, it may be readily removed either before or after firing (but preferably before since it is quite soft at this stage of processing) by conventional techniques. It is a distinct advantage of my process that it is not necessary to use backup plates with the pellet, as is required by conventional techniques. Rather, the pellets may be formed and used without backup plates, if desired, by soft soldering to the contact metallization or merely compressively mounting the pellet. Contact metallization together with the thick glass layer completely encapsulate the pellet allowing a complete device to be formed without auxiliary ecapsulation, if desired.

Figure 5:
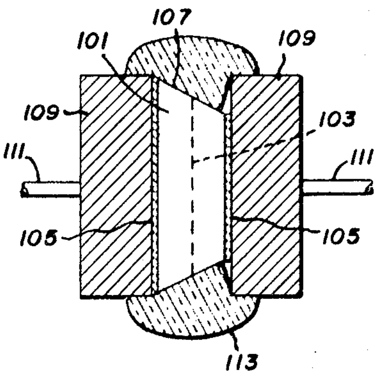
FIG. 5 is a sectional view of a conventionally constructed semiconductor device.

The advantages of my approach may be readily appreciated by reference to the conventional structural arrangement shown in FIG. 5. The pellet 101 containing junction 103 is provided with contact metallization 105 adjacent its opposed major surface portions. This contact metallization is adhered to the semiconductive crystal prior to subdivision of the pellet from the wafer and hence is carried through the entire process. For this reason the beveled peripheral surface 107 of the wafer lacks the freedom from metal ions characteristic of devices formed according to my process. Instead of using separable plates to mount the pellet for glass application, backup plates 109 are bonded to the contact metallization prior to glass deposition. Both backup plates are identically sized so that at least one of the plates overhangs the associated edge of the peripheral pellet surface. Device leads 111 are shown associated with the backup plates. The thick glass layer 113 overlies both the peripheral edge of the pellet and the peripheral edges of the backup plates. Thus, the backup plates are integrally bonded to the glass and cannot be readily removed to provide a device lacking backup plates or to allow reuse of the backup plates in processing additional pellets. Also, it is noted that the glass frequently fails to wet the pellet peripheral surface adjacent the overhanging edge of the backup plate so that a void is formed within the device. Such void formation is believed to be responsible for the rapid failure mechanism exhibited by some glass encapsulated and passivated semiconductor devices and is believed also to materially contribute to the inability of these devices to block large voltages. Noting FIG. 4, it can be seen that the thick glass layer adheres to the entire peripheral surface of the pellet and that no voids between the glass and pellet are formed.

In forming thick glass layers on the peripheral surfaces of pellets it has been observed that a more uniform distribution and adhesion of the glass to the crystal surface can be obtained if the pellet surface to be coated is preliminarily oxidized. Where the glass layer is to be deposited by electrophoresis, as is preferred, the oxide coating on the peripheral surface must be maintained sufficiently thin that it does not present an effective electrically insulative barrier. It has been observed quite unexpectedly that thin grown oxide coatings on the peripheral surfaces of up to 500 A. in thickness can be formed without adversely affecting the subsequent electrophoretic deposition of the glass. Since the preliminary oxidation of the peripheral surfaces is an optional feature of my process, the minimum thickness of the oxide coating is not considered critical. Any degree of oxidation will to some extent improve wettability of the peripheral surface. Distinct improvements for glass wettability with oxide coatings above about 25 A. in thickness have been observed. The formation of oxide coatings having thicknesses up to about 100 A. may be readily achieved by bringing silicon pellet surfaces into contact with a strong oxidizing agent, such as concentrated nitric acid or hydrogen peroxide. For example, submerging silicon pellets in boiling nitric acid for periods of from 1 to 20 minutes has been found to constitute a very satisfactory wettability treatment. The maximum time of exposure to the oxidizing agent is not critical, however, since the oxidation rate progressively decreases as the oxide layer increases in thickness. Instead of growing an oxide on the peripheral surface, the oxide may be deposited by other conventional techniques, such as vapor deposition, for example.

In a variant form of my process Steps F and G may be simultaneously performed merely by interposing the contact metallization together with backup plates, if desired, adjacent the pellet surfaces and between the mounting plates prior to glass fusion. According to a preferred technique a glass slurry may be applied to the peripheral surface of the pellet by electrophoresis or other glass-depositing techniques and radiant energy applied to heat the glass to its fusion temperature. This approach is particularly advantageous with transparent glasses, since the radiant energy passes through the glass and is converted to heat at the glass interface with the pellet. This heats the glass from its inside out insuring an intimate bonding of the glass to the pellet surface and facilitating the escape of volatilizable materials from the glass prior to fusion rather than the formation of bubbles in the glass. To avoid damage to or the direct bonding to the pellet of the mounting plates, they may be formed of a refractory material, such as boron nitride, graphite, hard glass, ceramic, etc. If contact metallization is interposed between the mounting plates and the pellet, it may fuse to the pellet surface during fusion of the glass. For example, aluminum contacts of either the ohmic or rectifying type may be readily applied by this technique. Steps E, F, and G may be all combined into a single combined operation where the glass is applied to the pellet in a fused or softened state.

What I claim and desire to secure by Letters Patent of the United States is:

1. A process for fabricating a glass encapsulated and passivated semiconductor device having improved stability and voltage-blocking capabilities comprising subdividing a pellet from a semiconductive crystal having first and second opposed major surfaces and at least one junction located therebetween so that the pellet is provided with first and second spaced surface portions conforming to the major surfaces of the original crystal and a peripheral surface formed by subdividing which intersects the periphery of the junction, etching the peripheral surface of the pellet adjacent the junction in an essentially metal-ion-free environment, flushing the pellet with an essentially metal-ion-free liquid, mounting the pellet between plates associated with the first and second spaced surface portions so that the peripheral surface is exposed, applying a thick glass passivant layer to the peripheral surface of the pellet overlying the junction, fusing the glass to form a unitary, impervious thick glass passivating and encasing layer circumscribing the junction intersection with the peripheral surface and tenaciously adhered to the pellet, and after etching and flushing applying contacts to the glass-free surfaces.

2. A process for fabricating a plurality of glass encapsulated and passivated semiconductor devices each having improved stability and voltage-blocking capabilities comprising releaseably mounting a silicon monocrystalline wafer having first and second major surfaces and at least one junction located therebetween so that the first major surface lies adjacent a mounting substrate and the second major surface faces outwardly thereof, mounting a plurality of protective discs in spaced relation over the second major surface, abrading the second major surface over the areal portions lying between the protecting discs to subdivide the wafer into a plurality of pellets, each pellet underlying one of the protective discs and having a first surface portion conforming thereto and a second portion corresponding to the first major surface of the wafer slightly larger than the first surface portion and a sloping peripheral surface, formed by abrading, joining the first and second surface portions having a positively beveled edge intersection with the junction, demounting and cleaning the pellets, bringing an acid etchant into contact with the peripheral surface of a plurality of pellets adjacent the junctions thereof in a substantially metal-ion-free environment to remove the peripheral surface portion damaged in subdividing, flushing the etched surface of these pellets with deionized water, mounting the pellets between plates associated with the first and second portions so that the peripheral surface is exposed, applying a thick glass passivant layer to the peripheral surface of the pellets adjacent their junctions, fusing the glass to form a unitary, impervious thick glass passivating and encasing layer circumscribing the junction intersections with the peripheral surfaces and tenaciously adhered to the pellets, and applying contacts to the glass-free surfaces.

3. A process for fabricating a glass encapsulated and passivated semiconductor device according to claim 2 in which the device is formed to be free of voids between the glass encapsulant and the peripheral surface including the additional step of sizing the plates to lie entirely within the boundaries of the first and second spaced surfaces of the pellet.

4. A process for fabricating a glass encapsulated and passivated semiconductor device according to claim 2 in which the device is formed to be free of voids between the glass encapsulant and the peripheral surface including the additional step of sizing the plates to substantially conform to the boundaries of the first and second spaced surface portions of the pellet.

5. A process for fabricating a glass encapsulated and passivated semiconductor device according to claim 2 in which the plates and pellet are rotated about a central axis passing therethrough while fusing the glass.

6. A process for fabricating a glass encapsulated and passivated semiconductor device according to claim 2 in which the contacts are applied to the first and second spaced surface portions of the pellet simultaneous with glass fusion.

7. A process for fabricating a glass encapsulated and passivated semiconductor device according to claim 2 in which the glass is applied to the pellet in a fused state.

8. A process for fabricating a glass encapsulated and passivated semiconductor device according to claim 2 in which the pellet is formed by sandblasting so that the first and second surface portions are of unequal size and the peripheral surface is positively beveled at its intersection with the junction.

9. A process for fabricating a glass encapsulated and passivated semiconductor device according to claim 2 in which the pellet is etched with an acid to remove surface damage produced in subdividing and the pellet is rapidly flushed free of acid with a large excess of deionized water having a resistivity greater than $10^6$ ohm-cm.

10. A process for fabricating a glass encapsulated and passivated semiconductor device according to claim 2 in which a glass layer is selectively applied to the peripheral surface by electrophoresis.

11. A process for fabricating a glass encapsulated and passivated semiconductor device according to claim 2 in which the peripheral surface of the pellet is treated to improve its wettability by glass and a glass layer is selectively applied to the peripheral surface b electrophoresis.

12. A process for fabricating a glass encapsulated and passivated semiconductor device according to claim 2 in which the steps of applying glass, fusing the glass, and applying contacts are performed simultaneously by interposing contact metallization between refractory mounting plates and the pellet surface portions and applying the glass in a fused state to the peripheral surface so that the heat from the glass bonds the contact metallization to the pellet surface portions.

13. A process for fabricating a glass encapsulated and passivated semiconductor device according to claim 2 in which the step of fusing the glass is accomplished by applying radiant energy to the glass after it is applied to the peripheral surface of the pellet.

* * * * *